US008058457B2

(12) United States Patent
Han et al.

(10) Patent No.: US 8,058,457 B2
(45) Date of Patent: *Nov. 15, 2011

(54) STAR-SHAPED OLIGOTHIOPHENE-ARYLENE DERIVATIVES AND ORGANIC THIN FILM TRANSISTORS USING THE SAME

(75) Inventors: Kook Min Han, Gyeonggi-Do (KR);
Eun Jeong Jeong, Gyeonggi-Do (KR);
Chang Ju Kim, Gyeonggi-Do (KR);
Eun Kyung Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/656,831

(22) Filed: Feb. 17, 2010

(65) Prior Publication Data
US 2010/0230663 A1 Sep. 16, 2010

Related U.S. Application Data

(62) Division of application No. 11/116,326, filed on Apr. 28, 2005, now Pat. No. 7,692,029.

(30) Foreign Application Priority Data

Nov. 29, 2004 (KR) .................................. 04-98674

(51) Int. Cl.
*C07D 409/14* (2006.01)
*C07D 417/14* (2006.01)
*C07D 413/14* (2006.01)
*H01L 51/00* (2006.01)

(52) U.S. Cl. ................ 549/59; 549/60; 549/83; 546/26; 546/29; 544/180; 544/233; 544/246; 544/343; 528/373; 528/377; 257/40

(58) Field of Classification Search .................... 549/59, 549/60, 83; 546/26; 544/180, 233, 246, 544/343; 528/373, 377; 257/40
See application file for complete search history.

(56) References Cited

U.S. PATENT DOCUMENTS

| 6,107,117 | A | 8/2000 | Bao et al. | |
|---|---|---|---|---|
| 7,368,510 | B2 * | 5/2008 | Lee et al. | 525/355 |
| 7,541,424 | B2 * | 6/2009 | Jeong et al. | 528/373 |

FOREIGN PATENT DOCUMENTS

| WO | WO 00/79617 | 12/2000 |
|---|---|---|
| WO | WO 2004/013122 | 2/2004 |

OTHER PUBLICATIONS

David J. Brennan et al., "Polyfluorenes as Organic Semiconductors for Polymeric Field Effect Transistors", Mat. Res. Soc. Symp. Proc., 2003 Materials Research Societs, pp. L6.1.1-L.6.1.6, vol. 771.
Sandrine Martin et al., "Source/Drain Contacts in Organic Polymer Thin Film Transistors", Mat. Res. Soc. Symp. Proc., 2003 Materials Research Society, pp. L6.2.1-L6.2.5, vol. 771.
Tommie W. Kelley et al., "High Performance Organic Thin Film Transistors", Mat. Res. Soc. Symp. Proc., 2003 Materials Research Society, pp. L6.5.1-L6.5.11, vol. 771.
Francis Garnier et al., "Molecular Engineering of Organic Semiconductors Design of Self-Assembly Properties in Conjugated Thiophene Oligomers", J. Am. Chem. Soc., 1993, pp. 8718-8721, vol. 115.
H. Sirringhaus et al., "High-Resolution Inkjet Printing of All-Polymer Transistor Circuits", Science, Dec. 15, 2000, pp. 2123-2126, vol. 290.
Cherioux et al., Chem. Commun., 2225-2226, 1998.
David J. Brennan, et al., "Polyfluorenes as Organic Semiconductors for Polymeric Field Effect Transistors", Mat. Res. Soc. Symo. Proc. vol. 771, 2003 Materials Research Society, pp. L6.1.1-L6.1.6.
Sandrine Martin, et al., "Source/drain contacts in organic polymer thin film transistors" Mat. Res. Soc. Symo. Proc. vol. 771, 2003 Materials Research Society, pp. L6.2.1-L6.2.6.
Tommie W. Kelley, et al., "High Performance Organic Thin Film Transistors", Mat. Res. Soc. Symo. Proc. vol. 771, 2003 Materials Research Society, pp. L6.5.1-L6.5.11.
Francis Garnier, et al., "Molecular Engineering of Organic Semiconductors: Design of Self-Assembly Properties in Conjugates Thiophene Oligomers" J. Am. Chem. Soc. 1993 vol. 115, pp. 8716-8721.
H. Sirringhaus, et al., "High-Resolution Inkjet Printing of All-Polymer Transistor Circuits," Science, vol. 290, Dec. 15, 2000, pp. 2123-2126.
Audebert, et al.; First example—tetrazine; Elsevier Science B.V.; 2004; Chem Abstract 140:339765.
Halik, et al.; Octupolar molecules—semiconductors; Infineon Technologies AG, Germany ; Feb. 2004; Chem Abstract 140: 173273.
Divisia-Blohorn, et al.; Conjugated—interactions; American Chemical Society; 2003; Chem Abstract 139: 59502.
Suzuki, et al.; Organic luminescence device; Canon Kabushiki Kaisha, Japan; 2003; Chem Abstract 138: 245328.
Sauvage, et al.; Comjugated polyrotaxanes; Royal Society of Chemistry; 2002; Chem Abstract 138: 39668.
Bang Lin Lee, et al. "Synthesis of New Alternating CT-Type Copolymers of Thiophene and Pyrido[3,4b]pyrazine Units: Their Optical and Electrochemical Properties in Comparison with Similar CT Copolymers of Thiophene with Pyridine and Quinoxaline", Macromolecules, vol. 32, pp. 1375-1382, 1999.
Sergei A. Ponomarenko et al., "Star-Shaped Oligothiophenes for Solution-Processible Organic Field-Effect Transistors", Advanced Functional Materials, vol. 13, pp. 591-596, 2003.
Office Action dated Jun. 21, 2011 for corresponding Japanese Patent Application No. 2005-343010.
Cherioux, et al., "Synthesis and characterisation of an octupolar polymer and new molecular octupoles with off-resonant third order optical nonlinearities", Jul. 1999, pp. 2083-2084.

* cited by examiner

*Primary Examiner* — Venkataraman Balasubramanian
(74) *Attorney, Agent, or Firm* — Harness, Dickey & Pierce, P.L.C.

(57) ABSTRACT

A star-shaped oligothiophene-arylene derivative in which an oligothiophene having p-type semiconductor characteristics is bonded to an arylene having n-type semiconductor characteristics positioned in the central moiety of the molecule and forms a star shape with the arylene, thereby simultaneously exhibiting both p-type and n-type semiconductor characteristics. Further, an organic thin film transistor using the oligothiophene-arylene derivative. The star-shaped oligothiophene-arylene derivative can be spin-coated at room temperature, leading to the fabrication of organic thin film transistors simultaneously satisfying the requirements of high charge carrier mobility and low off-state leakage current.

5 Claims, 3 Drawing Sheets

STAR-SHAPED OLIGOTHIOPHENE-ARYLENE DERIVATIVES AND ORGANIC THIN FILM TRANSISTORS USING THE SAME

This non-provisional application is a divisional application of U.S. application Ser. No. 11/116,326, filed Apr. 28, 2005, now U.S. Pat. No. 7,692,029, the entire contents of which are incorporated herein by reference, which claims priority under 35 U.S.C. §119(a) on Korean Patent Application No. 2004, 98674 filed on Nov. 29, 2004, the entire contents of which is herein expressly are incorporated herein by reference.

BACKGROUND OF THE INVENTION

1. Field of the Invention

The present invention relates to a star-shaped oligothiophene-arylene derivative and an organic thin film transistor using the derivative. More particularly, the present invention relates to a star-shaped oligothiophene-arylene derivative in which an oligothiophene having p-type semiconductor characteristics is bonded to an arylene having n-type semiconductor characteristics positioned in the central moiety of the molecule and forms a star shape with the arylene, thereby simultaneously exhibiting both p-type and n-type semiconductor characteristics.

2. Description of the Related Art

General organic thin film transistors (OTFTs) comprise a substrate, a gate electrode, an insulating layer, source/drain electrodes, and a channel layer. Organic thin film transistors are classified into bottom-contact (BC) OTFTs wherein a channel layer is formed on source and drain electrodes, and top-contact (TC) OTFTs wherein metal electrodes are formed on a channel layer by mask deposition.

Inorganic semiconductor materials, such as silicon (Si), have been commonly used as materials for channel layers of OTFTs. However, since the preparation of such inorganic semiconductor materials involves high costs and requires a high-temperature vacuum process to fabricate OTFTs, organic semiconductor materials are currently replacing inorganic semiconductor materials in order to fabricate large area, flexible displays at reduced costs.

Recently, studies on organic semiconductor materials for channel layers of OTFTs have been actively undertaken and the characteristics of the devices have been reported. Of these, a great deal of research is currently concentrated on low molecular weight materials and oligomers, e.g., melocyanines, phthalocyanines, perylenes, pentacenes, C60, thiophene oligomers, and the like. Lucent Technologies Inc. and 3M Inc. developed devices with charge carrier mobilities as high as 3.2-5.0 cm$^2$/Vs using a pentacene single crystal (*Mat. Res. Soc. Symp. Proc.* 2003, Vol. 771, L6.5.1-L6.5.11). In addition, CNRS, France, reported a device having a relatively high charge carrier mobility of 0.01-0.1 cm$^2$/Vs and a relatively high on/off current ratio ($I_{on}/I_{off}$ ratio) using an oligothiophene derivative (*J. Am. Chem. Soc.*, 1993, Vol. 115, pp. 8716-9721).

However, since the prior art devices are largely dependent on vacuum processes for thin film formation, the fabrication of the devices incurs considerable costs.

On the other hand, high molecular weight-based organic thin film transistors (charge carrier mobility: 0.01-0.02 cm$^2$/Vs) employing a polythiophene-based material (F8T2) have already been fabricated and tested (PCT Publication WO 00/79617, *Science*, 2000, vol. 290, pp. 2132-2126). U.S. Pat. No. 6,107,117 discloses the fabrication of an organic thin film transistor with a charge carrier mobility of 0.01-0.04 cm$^2$/Vs by employing polythiophene P3HT, which is a representative regioregular polymer.

Since the regioregular polythiophene P3H5 shows a charge carrier mobility of about 0.01 cm$^2$/Vs but a high off-state leakage current (10$^{-9}$ A or more), leading to a low $I_{on}/I_{off}$ ratio of 400 or less, it is not applicable to the fabrication of electronic devices.

Low molecular weight organic semiconductor materials for organic thin film transistors that can be spin-coated at room temperature and simultaneously satisfy the requirements of high charge carrier mobility and low off-state leakage current, have not hitherto been reported.

OBJECTS AND SUMMARY

Therefore, embodiments of the present invention have been made to satisfy the above-mentioned need in the art to which the present invention pertains. It is an object of the embodiments of the present invention to provide a star-shaped oligothiophene-arylene derivative in which an oligothiophene having p-type semiconductor characteristics is bonded to an arylene having n-type semiconductor characteristics positioned in the central moiety of the molecule and forms a star shape with the arylene, thereby enabling spin-coating at room temperature and simultaneously exhibiting both high charge carrier mobility and low leakage current.

In accordance with one aspect of the present invention, there is provided a star-shaped oligothiophene-arylene derivative represented by Formula 1 below:

Formula 1

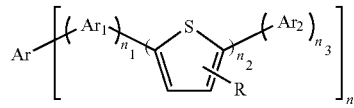

wherein

Ar is a C$_{2-30}$ arylene interrupted by at least one nitrogen atom which may be substituted with hydrogen, hydroxyl, amine, C$_{1-20}$ linear, branched or cyclic alkyl, alkoxy, C$_{1-20}$ alkoxyalkyl, alkylamine, ester or amide;

Ar$_1$ is a C$_{2-30}$ aryl group which may be interrupted by at least one heteroatom and may be substituted with hydrogen, hydroxyl, amine, C$_{1-20}$ linear, branched or cyclic alkyl, alkoxy, C$_{1-20}$ alkoxyalkyl, alkylamine, ester or amide;

Ar$_2$ is a C$_{5-30}$ aryl group which may be interrupted by at least one heteroatom and may be substituted with hydrogen, hydroxyl, amine, C$_{1-20}$ linear, branched or cyclic alkyl, alkoxy, C$_{1-20}$ alkoxyalkyl, alkylamine, ester or amide; the substituents R are independently hydrogen, hydroxyl, amine, C$_{1-20}$ linear, branched or cyclic alkyl, alkoxy, C$_{1-20}$ alkoxyalkyl, alkylamine, ester or amide;

n is an integer between 3 and 8;

n$_1$ and n$_3$ are each independently an integer between 0 and 6; and n$_2$ is an integer between 2 and 8.

In accordance with another aspect of the present invention, there is provided a method for preparing the star-shaped oligothiophene-arylene derivative.

In accordance with yet another aspect of the embodiments of the present invention, there is provided an organic thin film transistor in which the single molecular compound is used as a material for an organic active layer, thereby enabling spin-coating at room temperature and simultaneously satisfying the requirements of high charge carrier mobility and low off-state leakage current.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
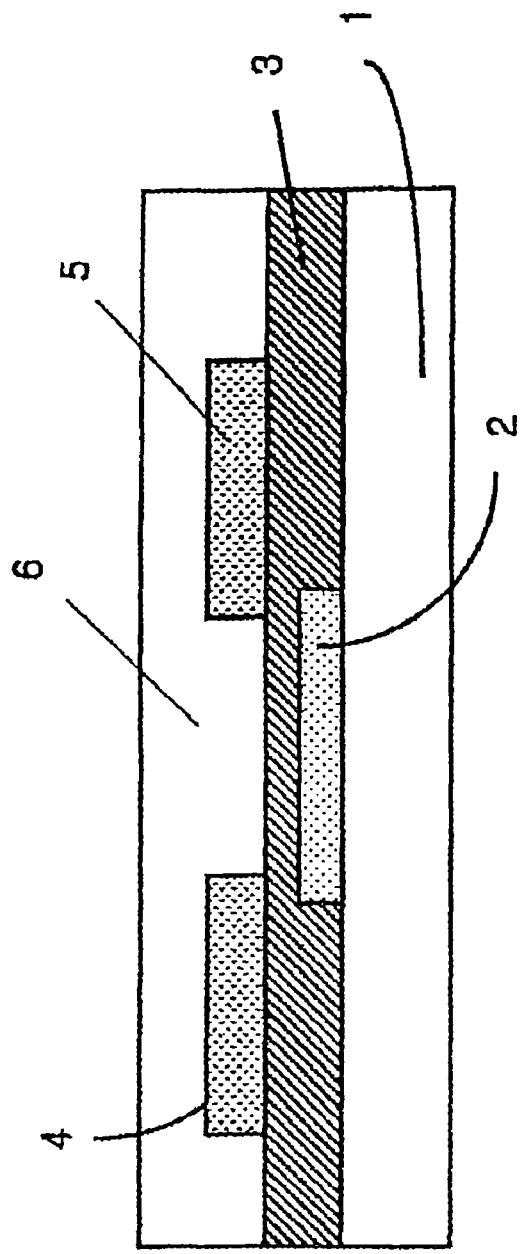
FIG. 1 is a cross-sectional view showing the structure of an organic thin film transistor fabricated in Example 1 of the present invention.
Figure 2:
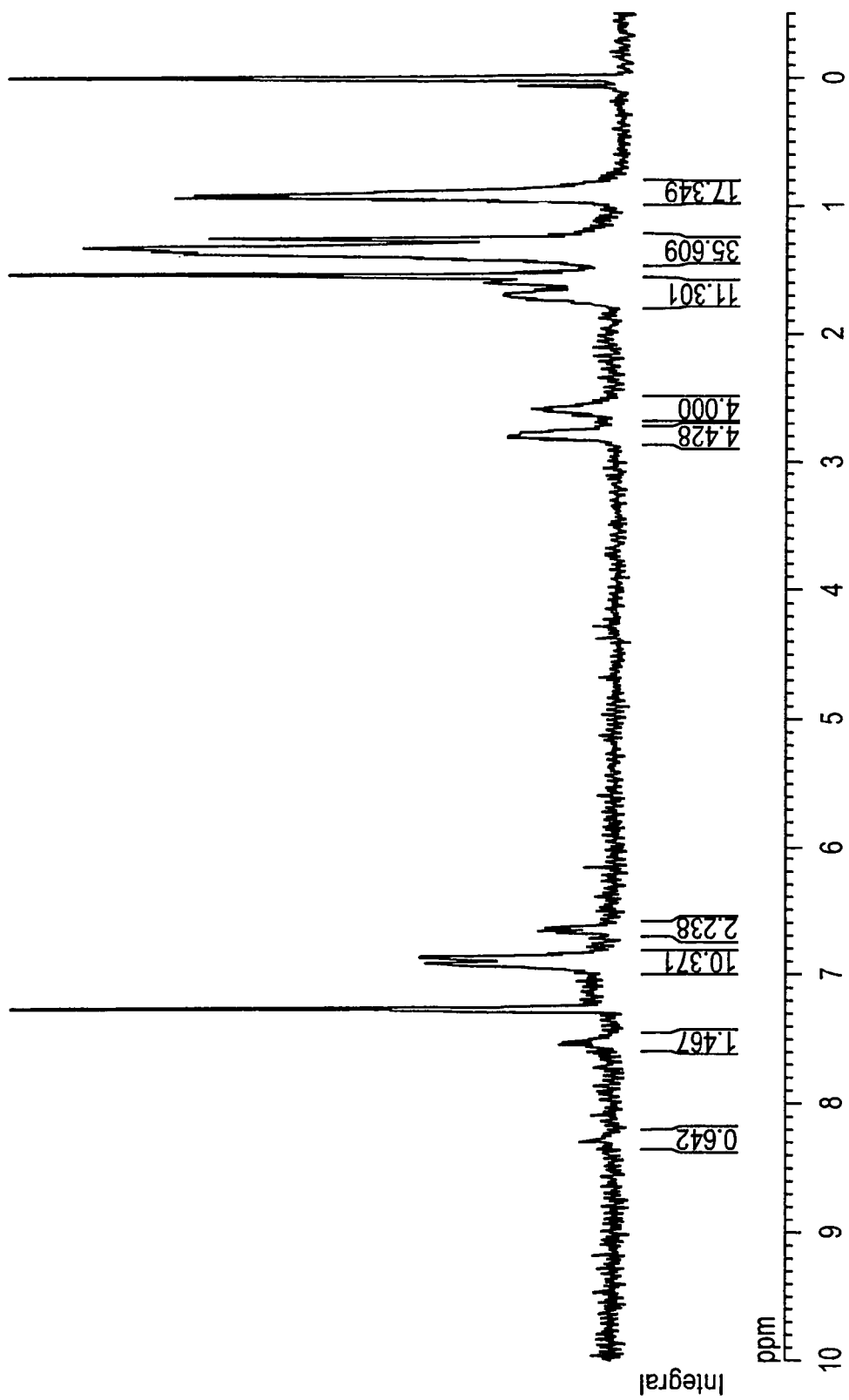
FIG. 2 is a $^1$H-NMR spectrum of an oligothiophene-arylene derivative prepared in Preparative Example 3 of the present invention.
Figure 3:
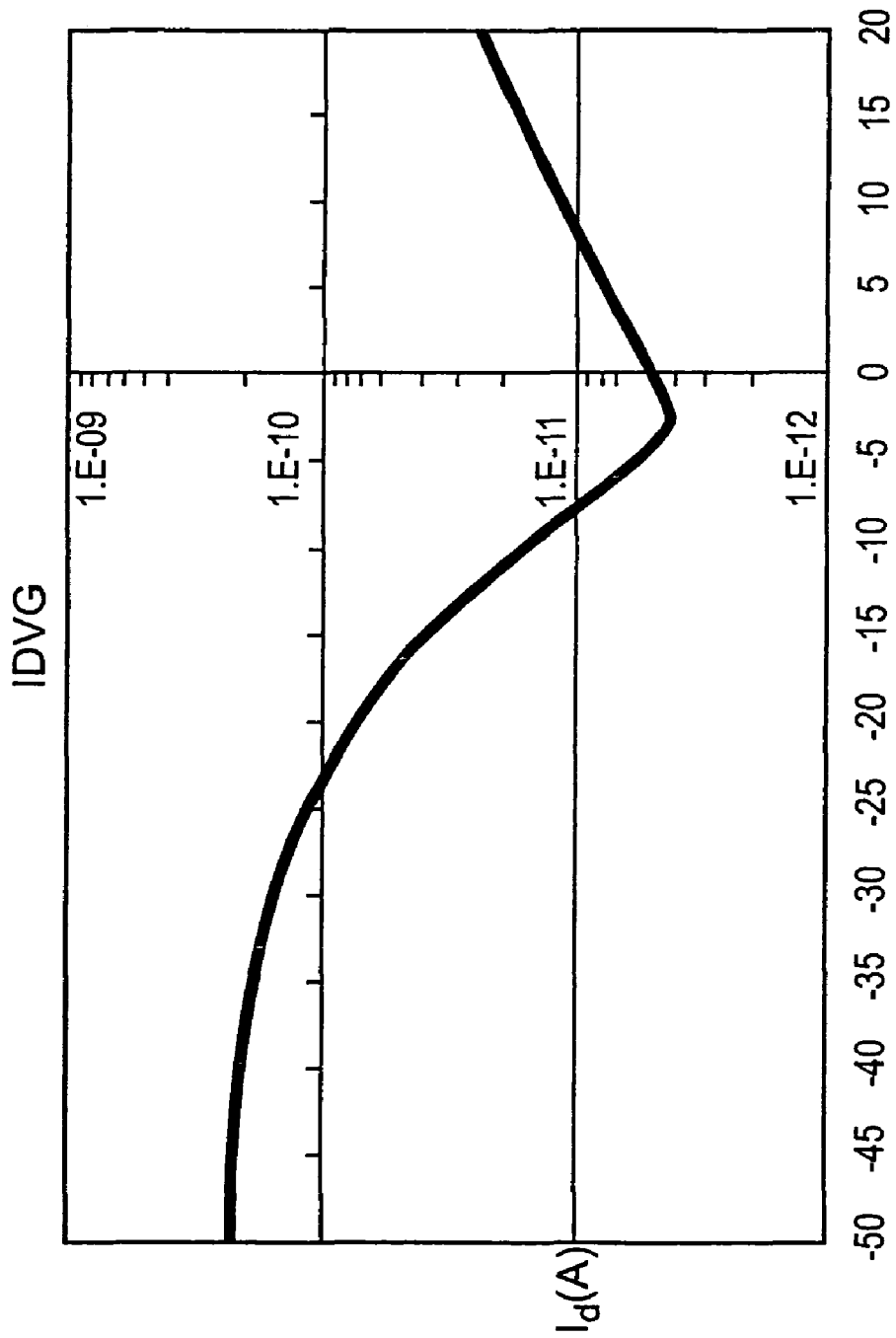
FIG. 3 is a graph showing the current transfer characteristics of an organic thin film transistor fabricated in Example 1 of the present invention.

Hereinafter, the embodiments of the present invention will be described in detail.

The embodiments of the present invention provide a star-shaped oligothiophene-arylene derivative in which an oligothiophene having p-type semiconductor characteristics is bonded to an arylene having n-type semiconductor characteristics positioned in the central moiety of the molecule and forms a star shape with the arylene.

The star-shaped oligothiophene-arylene derivative is represented by Formula 1 below:

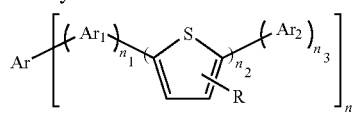

(1)

wherein

Ar is a $C_{2-30}$ arylene interrupted by at least one nitrogen atom which may be substituted with hydrogen, hydroxyl, amine, $C_{1-20}$ linear, branched or cyclic alkyl, alkoxy, $C_{1-20}$ alkoxyalkyl, alkylamine, ester or amide;

$Ar_1$ is a $C_{2-30}$ aryl group which may be interrupted by at least one heteroatom and may be substituted with hydrogen, hydroxyl, amine, $C_{1-20}$ linear, branched or cyclic alkyl, alkoxy, $C_{1-20}$ alkoxyalkyl, alkylamine, ester or amide;

$Ar_2$ is a $C_{5-30}$ aryl group which may be interrupted by at least one heteroatom and may be substituted with hydrogen, hydroxyl, amine, $C_{1-20}$ linear, branched or cyclic alkyl, alkoxy, $C_{1-20}$ alkoxyalkyl, alkylamine, ester or amide;

the substituents R are independently hydrogen, hydroxyl, amine, $C_{1-20}$ linear, branched or cyclic alkyl, alkoxy, $C_{1-20}$ alkoxyalkyl, alkylamine, ester or amide;

n is an integer between 3 and 8;

$n_1$ and $n_3$ are each independently an integer between 0 and 6; and $n_2$ is an integer between 2 and 8.

In the star-shaped oligothiophene-arylene derivative of Formula 1 according to the embodiments of the present invention, non-limiting representative examples of compounds corresponding to Ar include compounds represented by Formula 2 below:

Formula 2

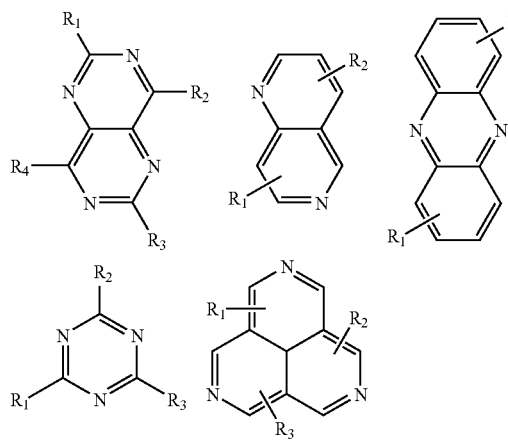

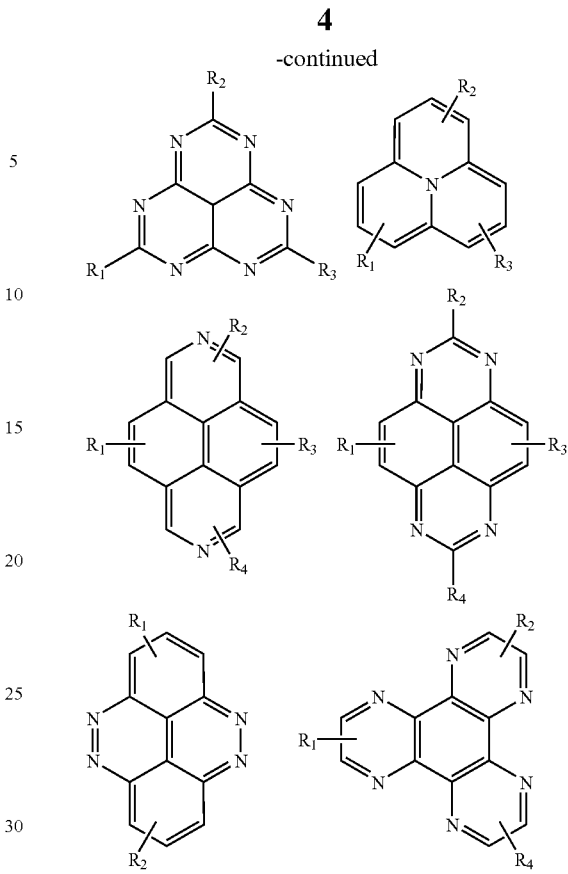

wherein $R_1$ to $R_4$ are independently hydrogen, hydroxyl, amine, $C_{1-20}$ linear, branched or cyclic alkyl, alkoxy, $C_{1-20}$ alkoxyalkyl, alkylamine, ester or amide.

Specific examples of the compounds of Formula 2 include, but are not limited to, thiadiazoles, oxazoles, isoxazoles, oxadiazoles, imidazoles, pyrazoles, thiadiazoles, triazoles, tetrazoles, pyridines, pyridazines, pyrimidines, pyrazines, triazines, quinolines, isoquinolines, quinoxalines, naphthyridines, benzoimidazoles, pyrimidopyrimidines, benzothiadiazoles, benzoselenadiazoles, benzotriazoles, benzothiazoles, benzoxazoles, phenanthrolines, phenazines, and phenanthridines.

In the star-shaped oligothiophene-arylene derivative of Formula 1 according to the embodiments of the present invention, non-limiting representative examples of compounds corresponding to $Ar_1$ include compounds represented by Formula 3 below:

Formula 3

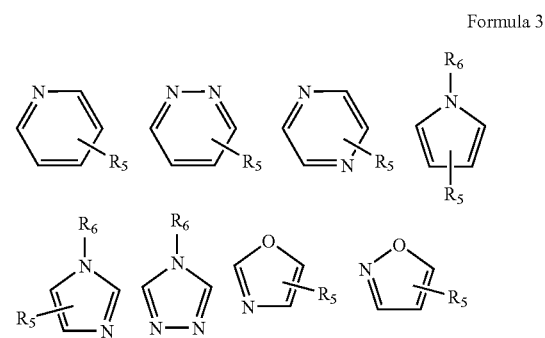

-continued

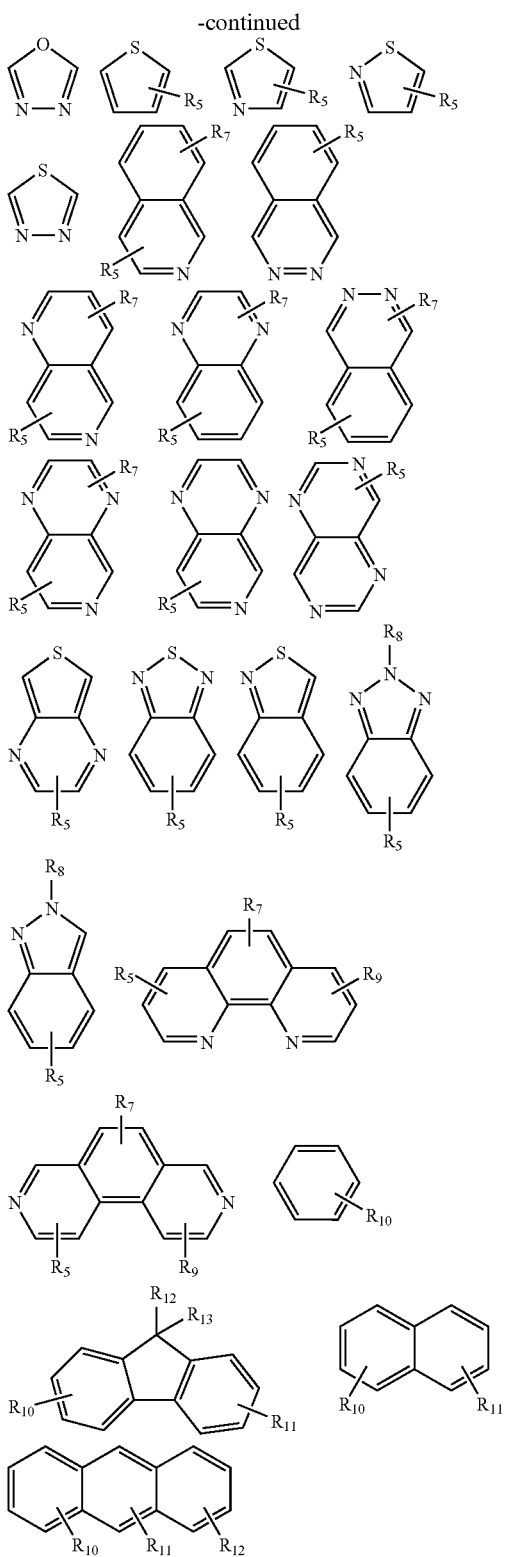

wherein
$R_5$ to $R_{13}$ are independently hydrogen, hydroxyl, amine, $C_{1-20}$ linear, branched or cyclic alkyl, alkoxy, $C_{1-20}$ alkoxyalkyl, alkylamine, ester or amide.

Specific examples of the compounds of Formula 3 include, but are not limited to, thiophenes, thiazoles, thiadiazoles, oxazoles, isoxazoles, oxadiazoles, imidazoles, pyrazoles, thiadiazoles, triazoles, tetrazoles, pyridines, pyridazines, pyrimidines, pyrazines, triazines, quinolines, isoquinolines, quinoxalines, naphthyridines, benzoimidazoles, pyrimidopyrimidines, benzothiadiazoles, benzoselenadiazoles, benzotriazoles, benzothiazoles, benzoxazoles, phenanthrolines, phenazines, phenanthridines, benzenes, naphthalenes, and fluorenes.

In the star-shaped oligothiophene-arylene derivative of Formula 1 according to the present invention, non-limiting representative examples of compounds corresponding to $Ar_2$ include compounds represented by Formula 4 below:

Formula 4

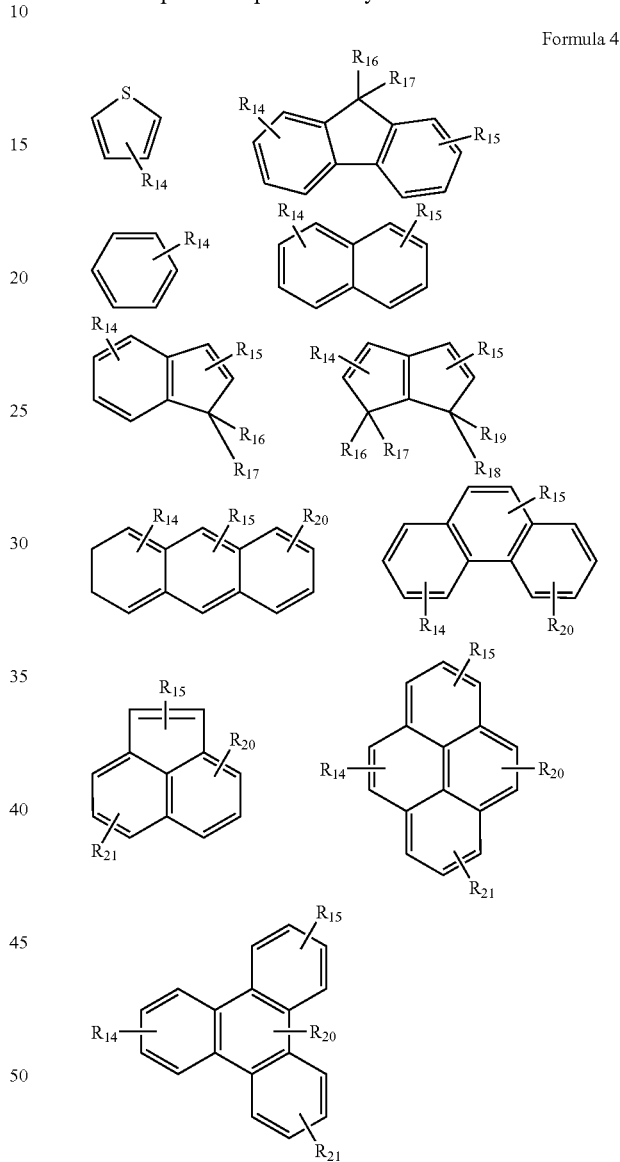

wherein
$R_{14}$ to $R_{21}$ are independently hydrogen, hydroxyl, amine, $C_{1-20}$ linear, branched or cyclic alkyl, alkoxy, $C_{1-20}$ alkoxyalkyl, alkylamine, ester or amide.

Specific examples of the compounds of Formula 4 include, but are not limited to, $C_{5-30}$ aromatic compounds, for example, benzenes, naphthalenes, anthracenes, and fluorenes.

The star-shaped oligothiophene-arylene derivative of the embodiments of the present invention can be synthesized by chemical or electrochemical oxidation and condensation using an organometallic compound of a transition metal, such as nickel or palladium, which are representative polymerization processes of heteroaromatic compounds.

That is, the star-shaped oligothiophene-arylene derivative of the embodiments of the present invention is synthesized by polymerizing compounds of Formulae 5 to 8 below:

  Formula 5 wherein Ar is as defined in Formula 1, $X_1$ is Br, Cl, or I, and m is an integer between 3 and 8;

  Formula 6 wherein $Ar_1$ is as defined in Formula 1, $X_2$ is a trialkyltin group, a dioxaborane group, or boronic acid, and $n_1$ is an integer between 0 and 6;

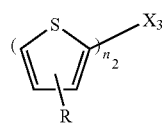  Formula 7 wherein R is as defined in Formula 1, $X_3$ is a trialkyltin group, a dioxaborane group, or boronic acid, and $n_2$ is an integer between 2 and 8; and

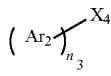  Formula 8 wherein $Ar_2$ is as defined in Formula 1, $X_4$ is a trialkyltin group, a dioxaborane group, or boronic acid, and $n_3$ is an integer between 0 and 6, at 70-130° C. in the presence of at least one catalyst represented by Formulae 9 to 11 below:

  Formula 9 wherein L is a ligand selected from the group consisting of triphenylphosphine (PPh$_3$), triphenylarsine (AsPh$_3$), triphenylphosphite (P(OPh)$_3$), diphenylphosphinoferrocene (dppf), diphenylphosphino butane (dppb), acetate (OAc), and dibenzylideneacetone (dba);

  Formula 10 wherein L is as defined in Formula 9, and X is I, Br or Cl; and

  Formula 11 wherein L is as defined in Formula 9.

Specifically, the star-shaped oligothiophene-arylene derivative of the embodiments of the present invention is synthesized through the reaction paths depicted by the following Reaction Scheme 1:

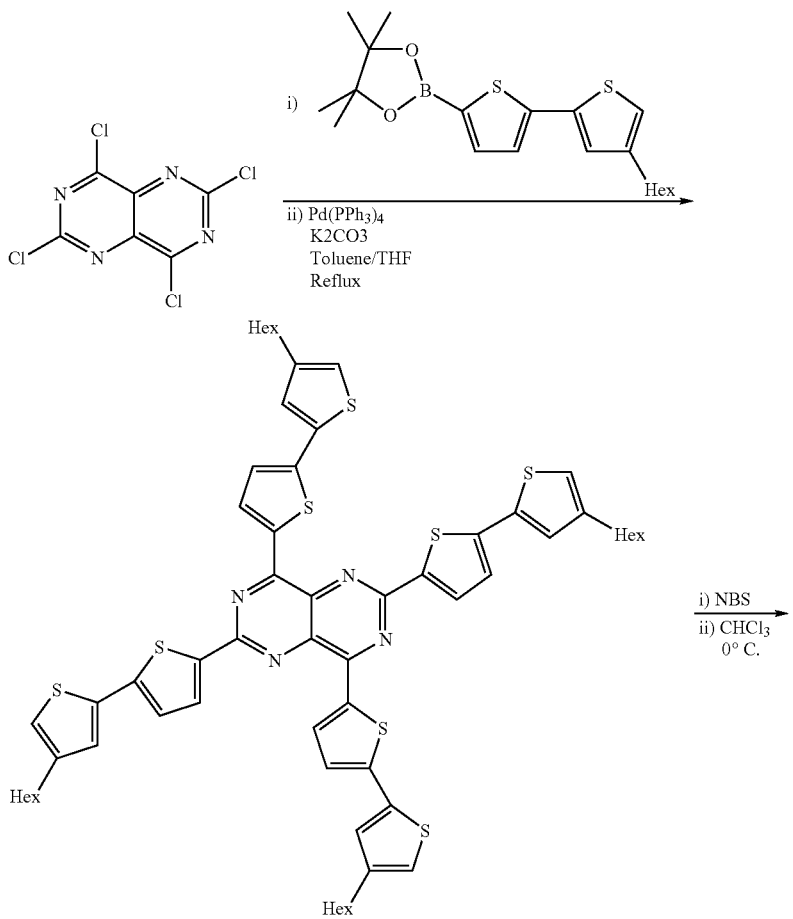

Reaction Scheme 1

-continued
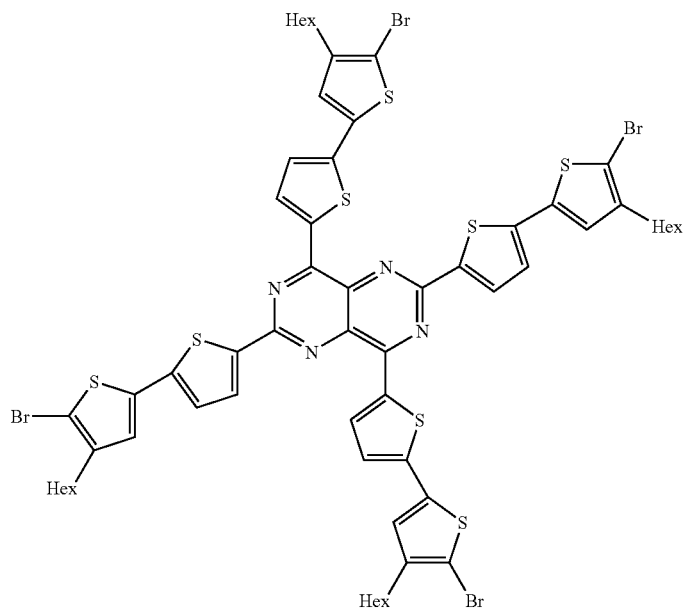
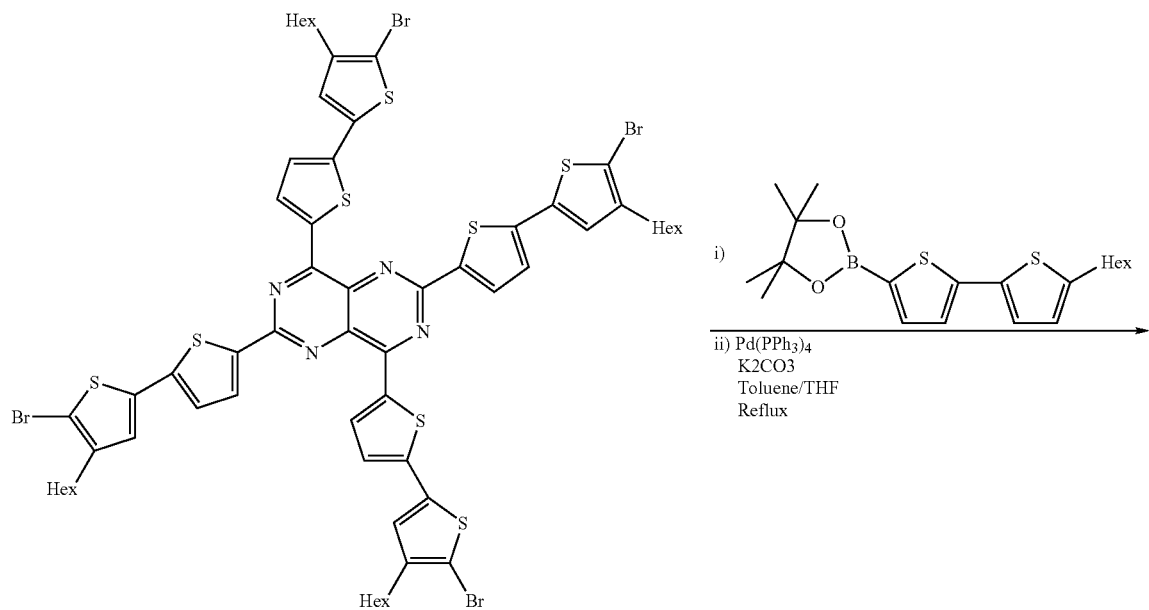

-continued

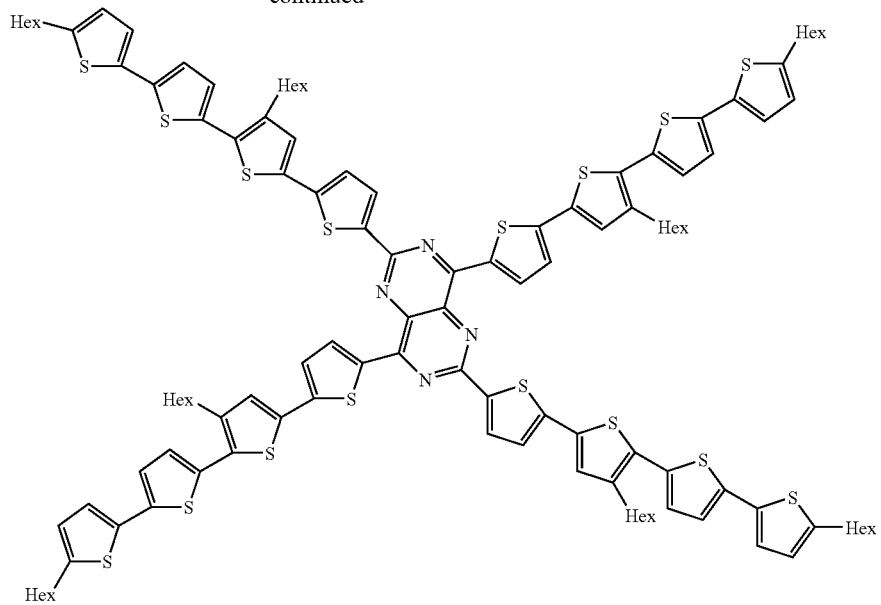

The star-shaped oligothiophene-arylene derivative is synthesized by the Suzuki coupling reaction. One example of a star-shaped oligothiophene-arylene derivative that can be synthesized by the Suzuki coupling reaction is the compound represented by Formula 12 below:

Formula 12

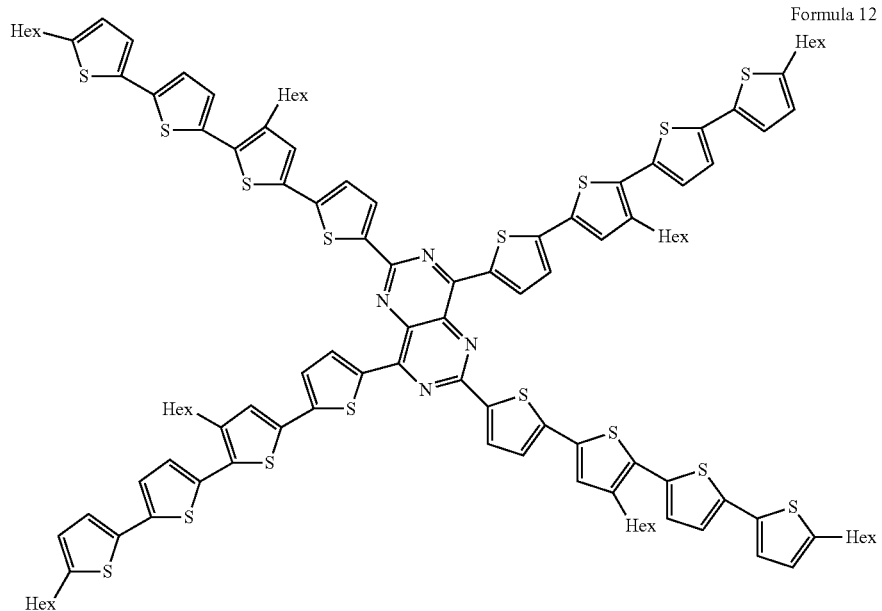

Halide-substituted arylene derivatives (e.g., the compound of Formula 5) and boron-substituted compounds (e.g., the compounds of Formulae 6 to 8) are used to synthesize the star-shaped oligothiophene-arylene derivative of Formula 12. Compounds used to prepare the oligothiophene-arylene derivative of Formula 12, an embodiment of the present invention, are those represented by Formulae 13 and 14 below:

Formula 13

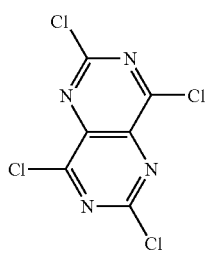

Formula 14

1

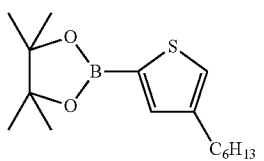

2

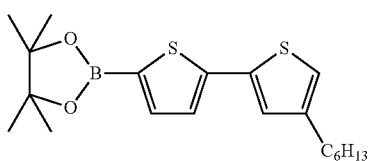

3

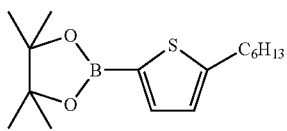

4

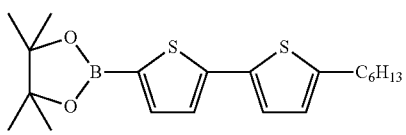

The star-shaped oligothiophene-arylene derivative of the embodiments of the present invention can be used as a novel organic semiconductor material for an active layer of an OTFT. General organic thin film transistors have structures of a substrate/a gate electrode/a gate insulating layer/an organic active layer/source-drain electrodes, a substrate/a gate electrode/a gate insulating layer/source-drain electrodes/an organic active layer, and the like, but are not limited to these structures.

At this time, the star-shaped oligothiophene-arylene derivative of the embodiments of the present invention can be formed into a thin film by, for example, screen printing, printing, spin coating, dipping, or ink spraying.

The gate insulating layer constituting the OTFT can be made of common high-dielectric constant insulators. Specific examples of suitable insulators include, but are not limited to, ferroelectric insulators, e.g., $Ba_{0.33}Sr_{0.66}TiO_3$ (BST), $Al_2O_3$, $Ta_2O_5$, $La_2O_5$, $Y_2O_3$, and $TiO_2$; inorganic insulators, e.g., $PbZr_{0.33}Ti_{0.66}O_3$ (PZT), $Bi_4Ti_3O_{12}$, $BaMgF_4$, $SrBi_2(TaNb)_2O_9$, $Ba(ZrTi)O_3$ (BZT), $BaTiO_3$, $SrTiO_3$, $Bi_4Ti_3O_{12}$, $SiO_2$, $SiN_x$, and AlON; and organic insulators, e.g., polyirpides, benzocyclobutenes (BCBs), parylenes, polyacrylates, polyvinylalcohols, polyvinylphenols, and the like.

The substrate can be made of, but is not limited to, glass, polyethylenenaphthalate (PEN), polyethyleneterephthalate (PET), polycarbonate, polyvinylalcohol, polyacrylate, polyimide, polynorbornene, polyethersulfone (PES), and the like.

The gate electrode and source-drain electrodes can be made of common metals. Specific examples of such metals include, but are not limited to, gold (Au), silver (Ag), aluminum (Al), nickel (Ni), indium tin oxide (ITO), and molybdenum/tungsten (Mo/W).

Embodiments of the present invention will now be described in more detail with reference to the following examples. However, these examples are given for the purpose of illustration and are not to be construed as limiting the scope of the invention.

Preparative Example 1

Preparation of Oligothiophene Borolanes 1 and 2

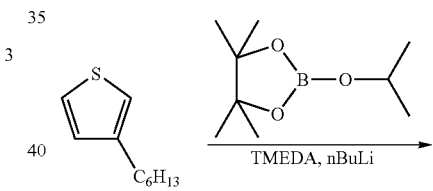

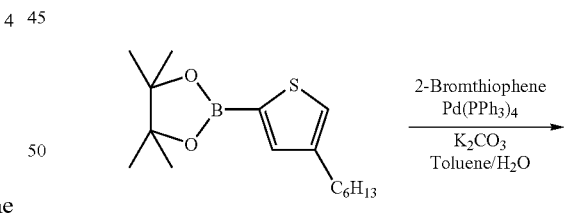

1

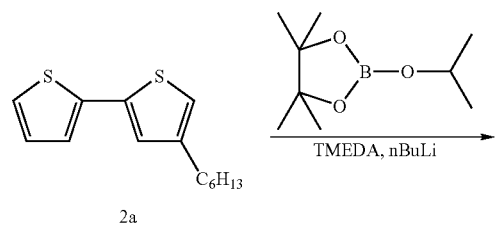

2a

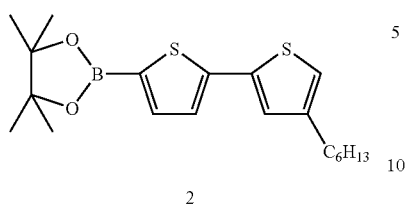

2 n-BuLi in tetrahydrofuran (THF) was added to 3-hexyl thiophene at −20° C., and then N,N,N',N'-tetramethylethylenediamine (TMEDA) was added thereto. The mixture was heated to 70° C. for 3 hours. Subsequently, dioxaborolane was added to the mixture at −78° C. and was slowly allowed to warm to room temperature to obtain the oligothiophene borolane 1.

The oligothiophene borolane 1 and 2-bromothiophene were added to a mixture of toluene and water, and then tetrakis(triphenylphosphine)palladium (0) (Pd(PPh$_3$)$_4$, Aldrich) as a catalyst and potassium carbonate were added thereto. The reaction mixture was allowed to react at 110° C. for 8 hours to obtain the compound 2a.

n-BuLi in tetrahydrofuran was added to the compound 2a at −20° C., and then N,N,N',N'-tetramethylethylenediamine (TMEDA) was added thereto. The mixture was heated to 70° C. for 3 hours. Subsequently, dioxaborolane was added to the mixture at −78° C. and was slowly allowed to warm to room temperature to afford the oligothiophene borolane 2.

$^1$H-NMR (300 MHz, CDCl$_3$) δ (ppm) 0.89 (t, 3H, J=6.8 Hz), 6H), 1.21-1.35 (m, 18H), 1.59-1.66 (m, 2H), 2.58 (t, 2H, J=7.8 Hz), 6.68 (s, 1H), 7.00 (s, 1H), 7.20 (d, 1H, J=3.5 Hz), 7.47 (d, 1H, J=3.5 Hz)

Preparative Example 2

Preparation of Oligothiophene Borolanes 3 and 4

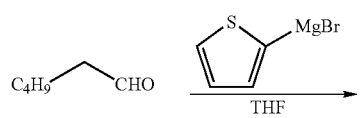

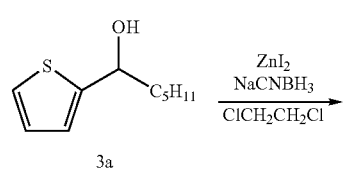

3a

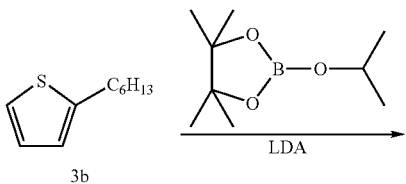
3b

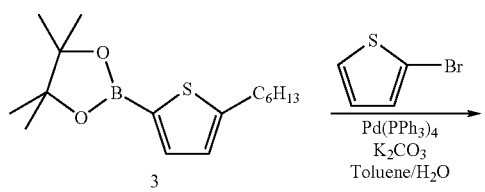
3

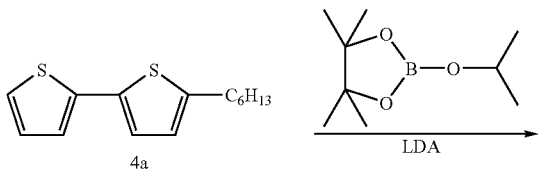
4a

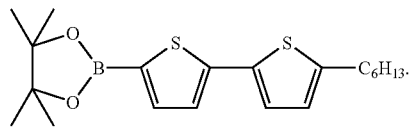
4

Thiophen-2-yl-magnesium bromide was added to a mixture of hexanal and THF to obtain the compound 3a. Zinc iodide, sodium cyanoborohydride and 1,2-dichloroethane were added to the compound 3a, and then the mixture was heated to 85° C. for 3 hours to obtain the compound 3b. Lithium diisopropylamide (LDA) in THF was added to the compound 3b at −78° C., and then dioxaborolane was added thereto to obtain the thiophene borolane 3. Thereafter, the thiophene borolane 3 and 2-bromobithiophene were reacted under the same conditions as in the preparation of the compound 2a indicated in Preparative Example 1 to obtain the compound 4a. Lithium diisopropylamide (LDA) in THF was added to the compound 4a at −78° C., and then dioxaborolane was added thereto to afford the oligothiophene borolane 4.

$^1$H-NMR (300 MHz, CDCl$_3$) δ (ppm) 0.89 (t, 3H, J=6.8 Hz), 1.25-1.43 (m, 18H), 1.60-1.75 (m, 2H), 2.78 (t, 2H, J=7.5 Hz), 6.65 (d, 1H, J=3.5 Hz), 7.04 (d, 1H, J=3.5 Hz), 7.15 (d, 1H, J=3.5 Hz), 7.49 (d, 1H, J=3.5 Hz)

Preparative Example 3
Preparation of Oligothiophene-Arylene Derivative 1
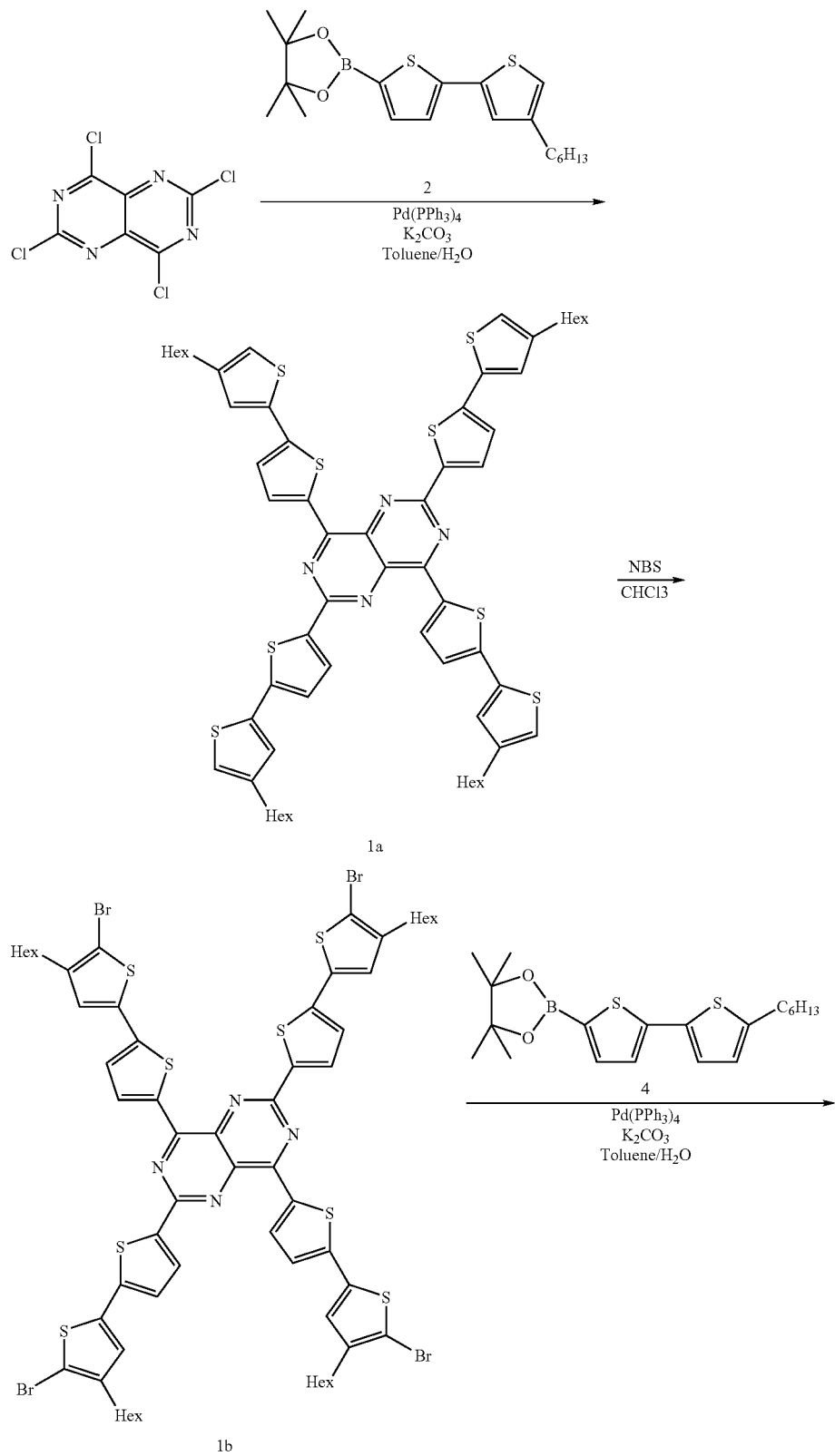

-continued

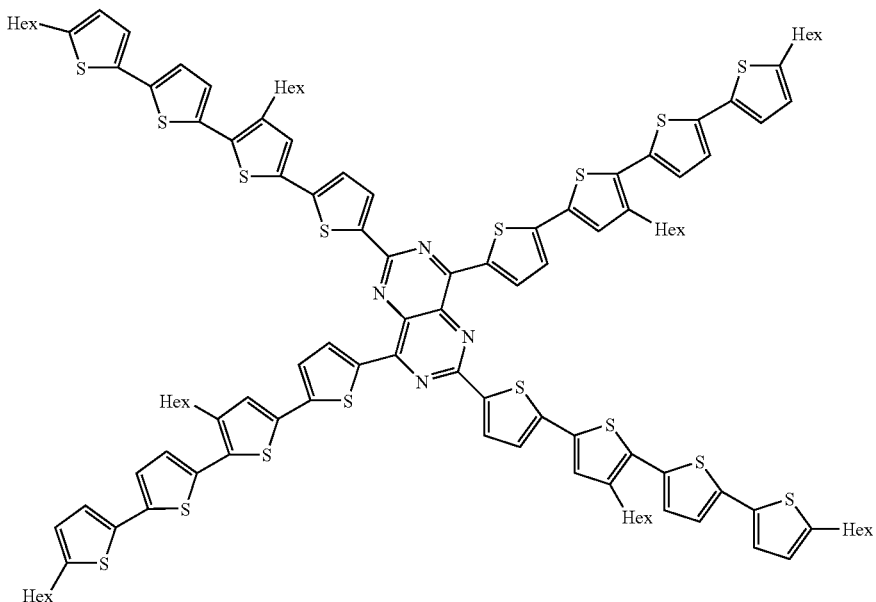

1

2,4,6,8-Tetrachloro-pyrimido[5,4-d]pyrimidine (TCl) and the oligothiophene borolane 2 were subjected to condensation by the Suzuki coupling reaction to obtain the compound 1a. To the compound 1a was added N-bromosuccinimide (NBS) in chloroform to obtain the dibromide 1b. The dibromide 1b and the oligothiophene borolane 4 were mixed with toluene and water, and then Pd(PPh$_3$)$_4$ as a catalyst and potassium carbonate in a solvent were added thereto. The resulting mixture was heated to 110° C. for 8 hours and washed with an aqueous ammonium chloride solution. The obtained organic layer was distilled under reduced pressure and purified by silica gel column chromatography, affording the derivative 1.

$^1$H-NMR (300 MHz, CDCl$_3$) δ (ppm) 0.85-0.94 (m, 24H), 1.29-1.42 (m, 48H), 1.56-1.63 (m, 8H), 1.63-1.76 (m, 8H), 2.53-2.65 (m, 8H), 2.73-2.81 (m, 8H), 6.50-6.60 (m, 4H), 6.81-6.90 (m, 20H), 7.52 (s, 2H), 8.28 (s, 2H)

Fabrication of OTFTs

Example 1

Fabrication of Organic Thin Film Transistor Using Oligothiophene-Arylene Derivative 1

First, molybdenum/tungsten (Mo/W) were deposited on a glass substrate that had been previously washed by a sputtering process to form a gate electrode having a thickness of 1,000 Å. Thereafter, a polyacrylate-based polymer was deposited on the gate electrode by a spin-coating process to form a gate insulating film, and was then dried at 150° C. for one hour. Gold (Au) as a material for source-drain electrodes was deposited on the gate insulating layer to a thickness of 500 Å by a sputtering process. Separately, the oligothiophene-arylene derivative 1 prepared in Preparative Example 3 was dissolved in toluene to obtain a 2 wt % solution. The solution was applied to the resulting structure at 1,000 rpm to a thickness of 800 Å, and baked at 100° C. for one hour to fabricate an OTFT as schematically illustrated in FIG. 1.

Comparative Example 1

An organic thin film transistor was fabricated in the same manner as in Example 1, except that polyhexylthiophene HT-P3HT (Aldrich) was used.

Evaluation of Electrical Properties of OTFTs

The charge carrier mobility of the devices fabricated in Example 1 and Comparative Example 1 was measured. The current transfer characteristics of the devices were evaluated using a KEITHLEY semiconductor characterization system (4200-SCS), and curves were plotted. The obtained results are shown in Table 1. The charge carrier mobility was calculated using the curve from the following current equations in the saturation region.

The charge carrier mobility was calculated from the slope of a graph representing the relationship between $(I_{SD})^{1/2}$ and $V_G$ from the following current equations in the saturation region:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

-continued $$\text{slope} = \sqrt{\frac{\mu C_0 W}{2L}}$$

$$\mu_{FET} = (\text{slope})^2 \frac{2L}{C_0 W}$$

In the above equations, $I_{SD}$: source-drain current, $\mu$ and $\mu_{FET}$: charge carrier mobility, $C_o$: capacitance of the oxide film, W: channel width, L: channel length; $V_G$: gate voltage, and $V_T$: threshold voltage.

Off-state leakage current ($I_{off}$) is a current flowing in the off-state, and was determined from the minimum current in the off-state.

TABLE 1

| Organic active layer | Charge carrier mobility (cm²/Vs) | Off-state leakage current (A) |
|---|---|---|
| Example 1 | 0.00005 | $1 \times 10^{-12}$ |
| Comparative Example 1 (HT-P3HT) | 0.01 | $1 \times 10^{-8}$ |

As can be seen from the data shown in Table 1, the oligothiophene-arylene derivatives of the present invention showed a considerably low off-state leakage current of $1 \times 10^{-12}$ A and a high charge carrier mobility of 0.00005.

As apparent from the foregoing, the star-shaped oligothiophene-arylene derivative of the present invention is a low-molecular weight organic semiconductor material with a novel structure. In addition, since the oligothiophene-arylene derivative can be spin-coated at room temperature, is stable, and exhibits low off-state leakage current, it can be used as a material for an active layer of an OTFT.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An organic thin film transistor comprising a substrate, a gate electrode, a gate insulating layer, an organic active layer and source-drain electrodes wherein the organic active layer is made of a star-shaped oligothiophene-arylene compound including an oligothiophene having p-type semiconductor characteristics bonded to an arylene having n-type semiconductor characteristics, the oligothiophene positioned in a central moiety of the molecule, represented by Formula 1 below, to form a star shape with the arylene:

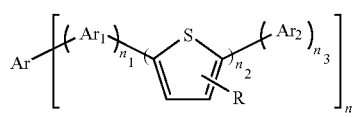

(1)

wherein Ar is selected from groups represented by Formula 2 below:

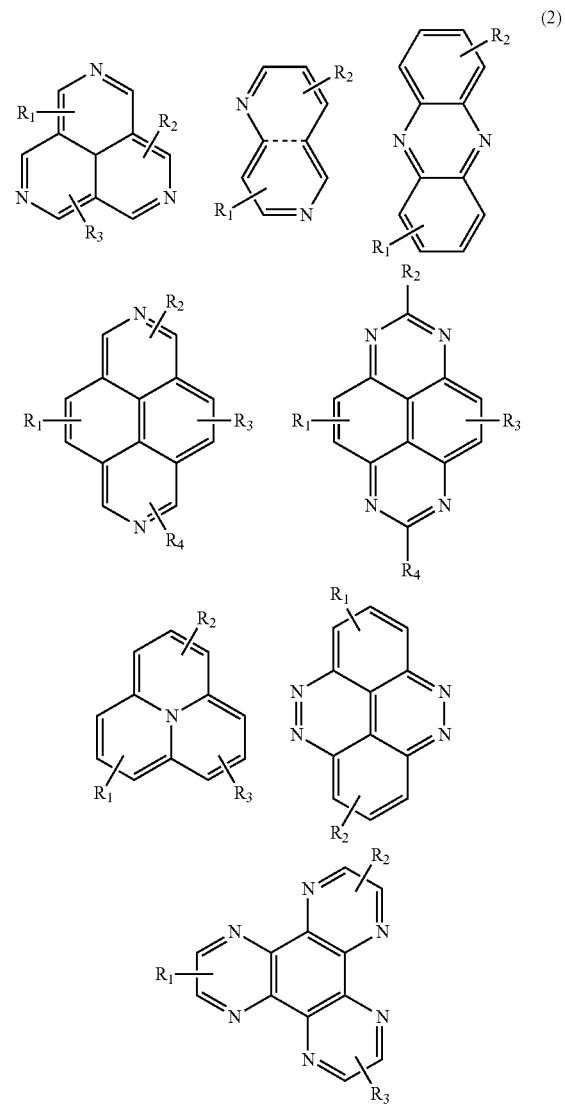

(2)

wherein $R_1$, $R_2$, $R_3$, and $R_4$ are independently hydrogen, hydroxyl, amine group, $C_{1-20}$ linear, branched or cyclic alkyl, alkoxy, $C_{1-20}$ alkoxyalkyl, alkylamine group, ester group or amide group, wherein $Ar_1$ is selected from groups represented by Formula 3 below:

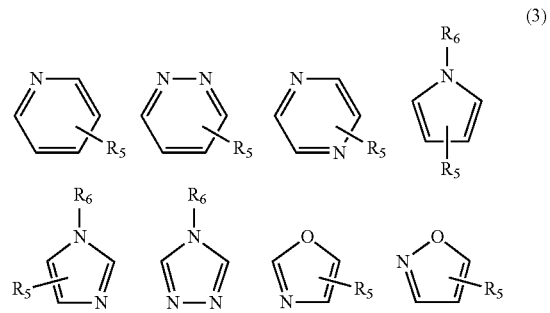

(3)

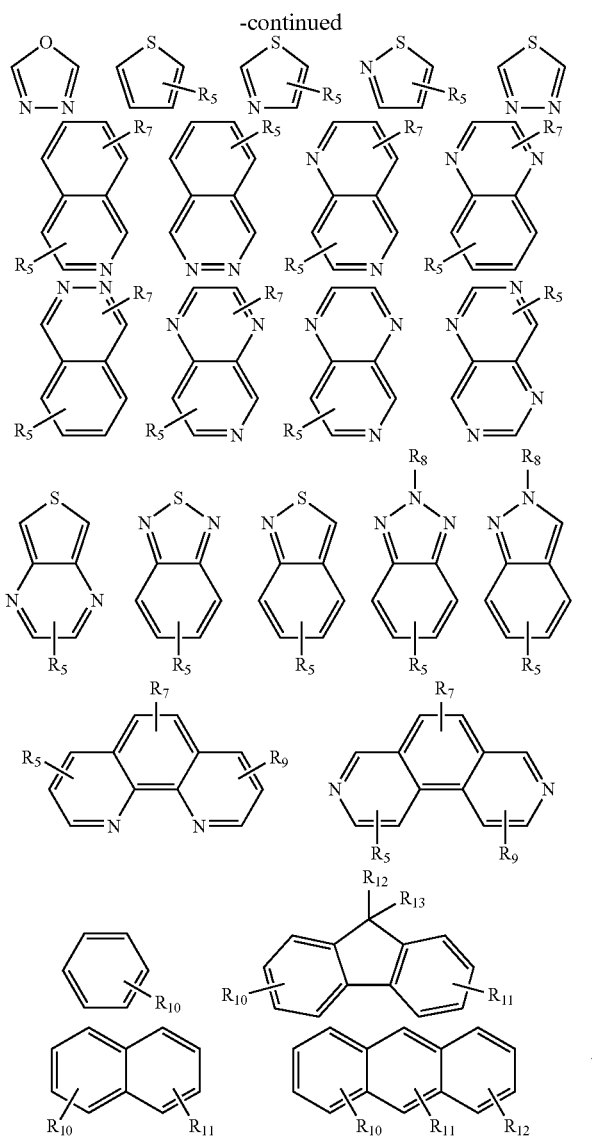

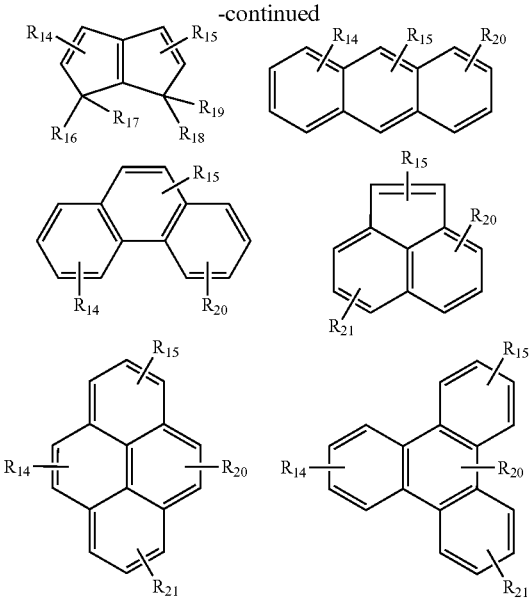

wherein $R_5$, $R_6$, $R_7$, $R_8$, $R_9$, $R_{10}$, $R_{11}$, $R_{12}$, $R_{13}$ are independently hydrogen, a hydroxyl group, an amine group, a $C_{1-20}$ linear, branched or cyclic alkyl group, an alkoxy group, a $C_{1-20}$ alkoxyalkyl group, an alkylamine group, an ester group or an amide group, wherein $Ar_2$ is selected from groups represented by Formula 4 below:

(4)

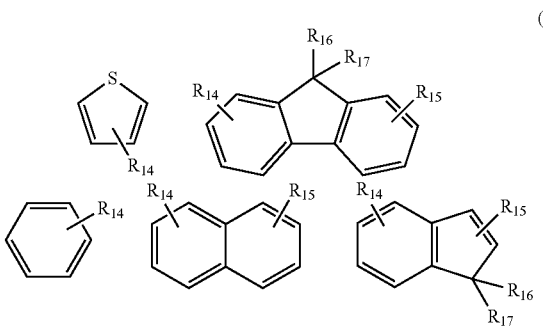

wherein $R_{14}$, $R_{15}$, $R_{16}$, $R_{17}$, $R_{18}$, $R_{19}$, $R_{20}$, $R_{21}$, are independently hydrogen, a hydroxyl group, an amine group, a $C_{1-20}$ linear, branched or cyclic alkyl group, an alkoxy group, a $C_{1-20}$ alkoxyalkyl group, an alkylamine group, an ester group or an amide group, R is hydrogen, a hydroxyl group, an amine group, a $C_{1-20}$ linear, branched or cyclic alkyl group, an alkoxy group, a $C_{1-20}$ alkoxyalkyl group, an alkylamine group, an ester group or an amide group, n is an integer between 3 and 8, $n_1$ and $n_3$ are each independently an integer between 0 and 6, and $n_2$ is an integer between 2 and 8.

2. The organic thin film transistor according to claim 1, wherein the organic active layer is formed into a thin film by screen printing, printing, spin coating, dipping, or ink spraying.

3. The organic thin film transistor according to claim 1, wherein the gate insulating layer is made of a ferroelectric insulator selected from the group consisting of $Ba_{0.33}Sr_{0.66}TiO_3$, $Al_2O_3$, $Ta_2O_5$, $La_2O_5$, $Y2O_3$, and $TiO_2$; an inorganic insulator selected from the group consisting of $PbZr_{0.33}Ti_{0.66}O_3$, $Bi_4Ti_3O_{12}$, $BaMgF_4$, $SrBi_2(TaNb)_2O_9$, $Ba(ZrTi)O_3$, $BaTiO_3$, $SrTiO_3$, $Bi_4Ti_3O_{12}$, $SiO_2$, $SiN_x$, and AlON; or an organic insulator selected from the group consisting of polyimides, benzocyclobutenes, parylenes, polyacrylates, polyvinylalcohols, and polyvinylphenols.

4. The organic thin film transistor according to claim 1, wherein the substrate is made of a material selected from the group consisting of glass, polyethylenenaphthalate, polyethyleneterephthalate, polycarbonate, polyvinylalcohol, polyacrylate, polyimide, polynorbornene, and polyethersulfone.

5. The organic thin film transistor according to claim 1, wherein the gate electrode and source-drain electrodes are independently made of a material selected from the group consisting of gold, silver, aluminum, nickel, indium tin oxide, and molybdenum/tungsten.

* * * * *